United States Patent [19]

Shikatani

[11] Patent Number: 5,345,425
[45] Date of Patent: Sep. 6, 1994

[54] SEMICONDUCTOR MEMORY DEVICE

[75] Inventor: Junichi Shikatani, Kawasaki, Japan

[73] Assignee: Fujitsu Limited, Kawasaki, Japan

[21] Appl. No.: 852,638

[22] PCT Filed: Nov. 19, 1991

[86] PCT No.: PCT/JP91/01578

§ 371 Date: Aug. 6, 1992

§ 102(e) Date: Aug. 6, 1992

[87] PCT Pub. No.: WO92/09085

PCT Pub. Date: May 29, 1992

[30] Foreign Application Priority Data

Nov. 20, 1990 [JP] Japan ............................ 2-314613

[51] Int. Cl.$^5$ ............................................ G11C 11/40
[52] U.S. Cl. .......................... 365/230.01; 365/189.01
[58] Field of Search ..................... 365/149, 51, 189.01, 365/230.01, 189.06, 189.11

[56] References Cited

U.S. PATENT DOCUMENTS 4,712,194 12/1987 Yamaguchi et al. ................ 365/203
4,953,127 8/1990 Nagahashi et al. ............. 365/189.05

FOREIGN PATENT DOCUMENTS 0233968  9/1987  European Pat. Off. .
0288860 11/1988  European Pat. Off. .
0384673  8/1990  European Pat. Off. .
62-54891  3/1987  Japan .
62-121986 6/1987  Japan .
62-134890 6/1987  Japan .
63-259896 10/1988 Japan .

OTHER PUBLICATIONS

Sakurai et al., "A Low Power 46 ns 256 kbit CMOS Static RAM with Dynamic Double Word Line," *IEEE Journal of Solid-State Circuits*, vol. SC-19, No. 5, Oct. 1984, pp. 578–585.
*Patent Abstracts of Japan*, vol. 11, No. 340 (P–634), Nov. 7, 1987 & JP-A-62-121986 (Sony) Jun. 3, 1987.
*Patent Abstracts of Japan*, vol. 11, No. 358 (P–639), Nov. 21, 1987 & JP-A-62-134890 (Matsushita Electric Ind.) Jun. 17, 1987.
*Patent Abstracts of Japan*, vol. 13, No. 75 (P–831), Feb. 21, 1989 & JP-A-63-259896 (NEC) Oct. 26, 1988.

Primary Examiner—Terrell W. Fears
Attorney, Agent, or Firm—Staas & Halsey

[57] ABSTRACT

A semiconductor memory device has a memory part, first and second write bit lines coupled to the memory part and used exclusively for writing information into the memory part and first and second read bit lines coupled to the memory part and used exclusively for reading information, held in the memory part, from the memory part. A short-circuiting circuit short-circuits the first and second read bit lines and thereby sets them to the same potential, in a write mode of operation of the semiconductor memory device in which information is written into the memory part via the first and second write bit lines. The short-circuiting circuit permits a read operation to be performed immediately following a write operation, at a high speed.

7 Claims, 10 Drawing Sheets

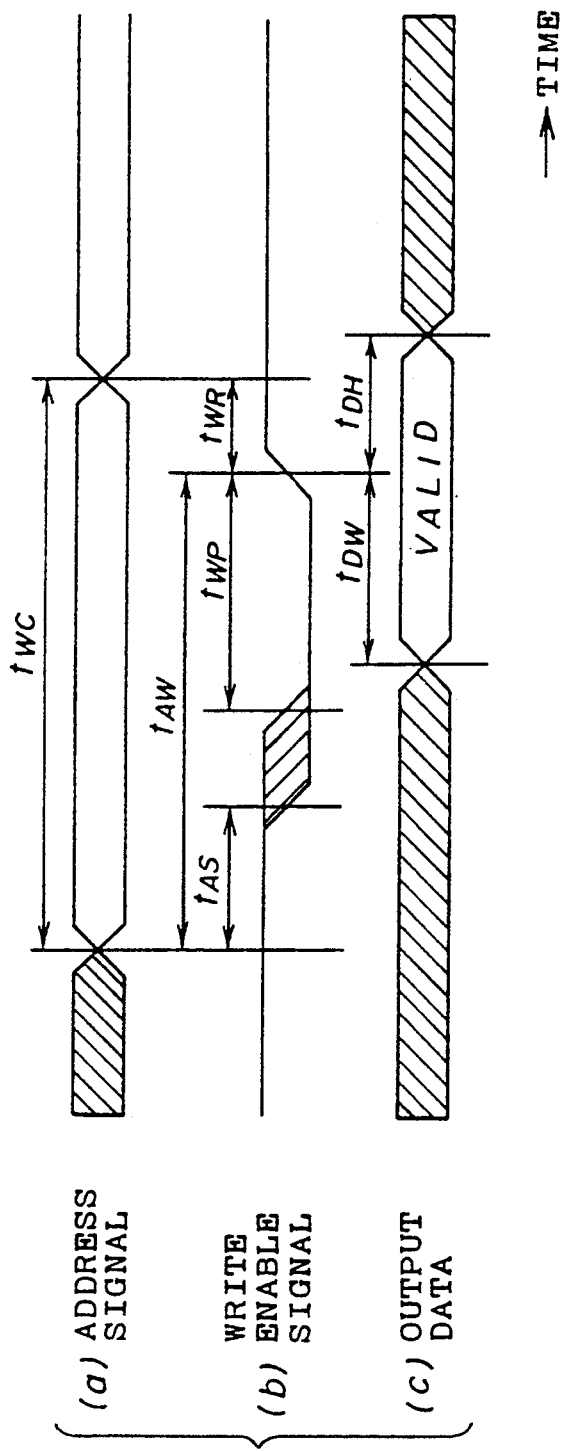

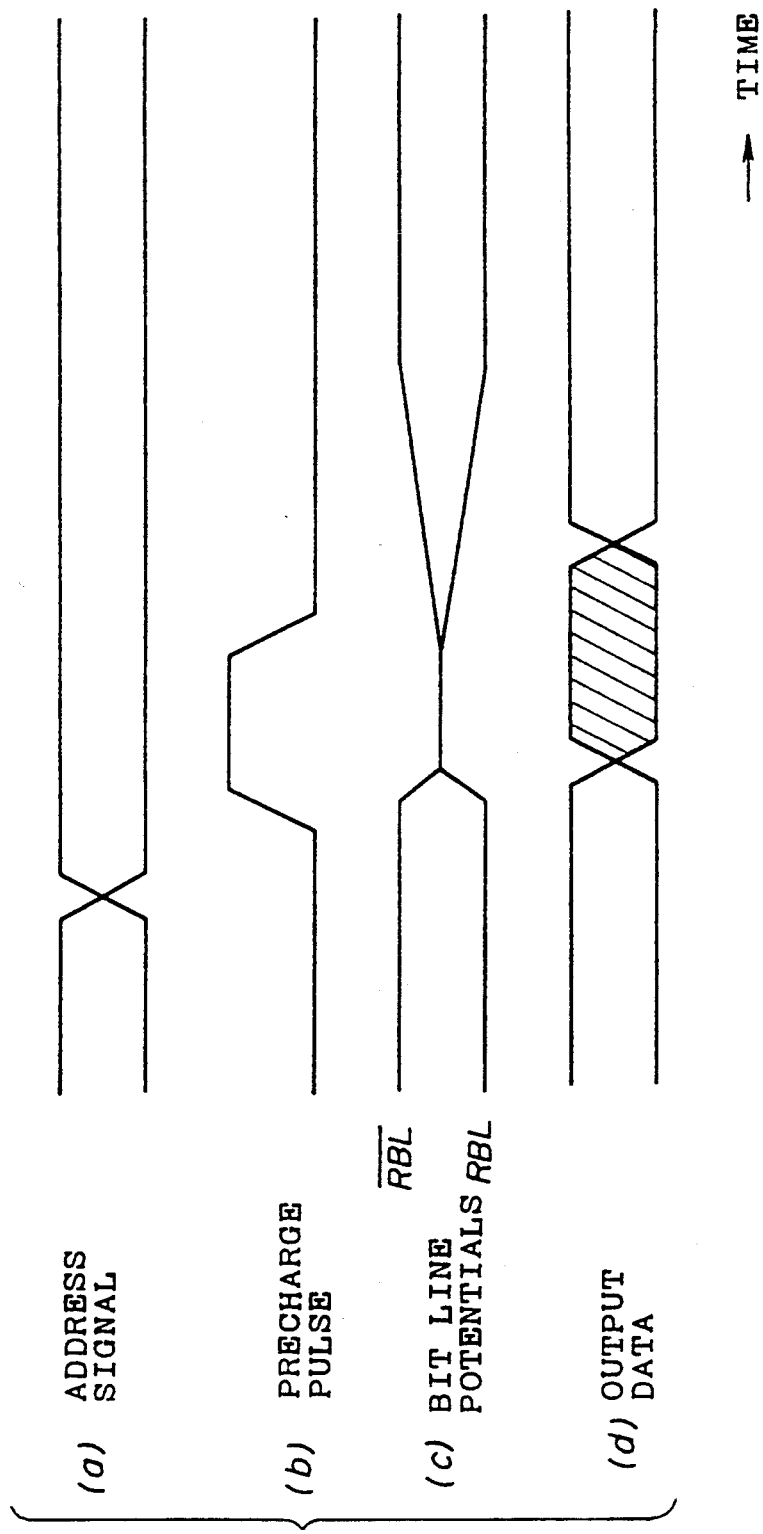

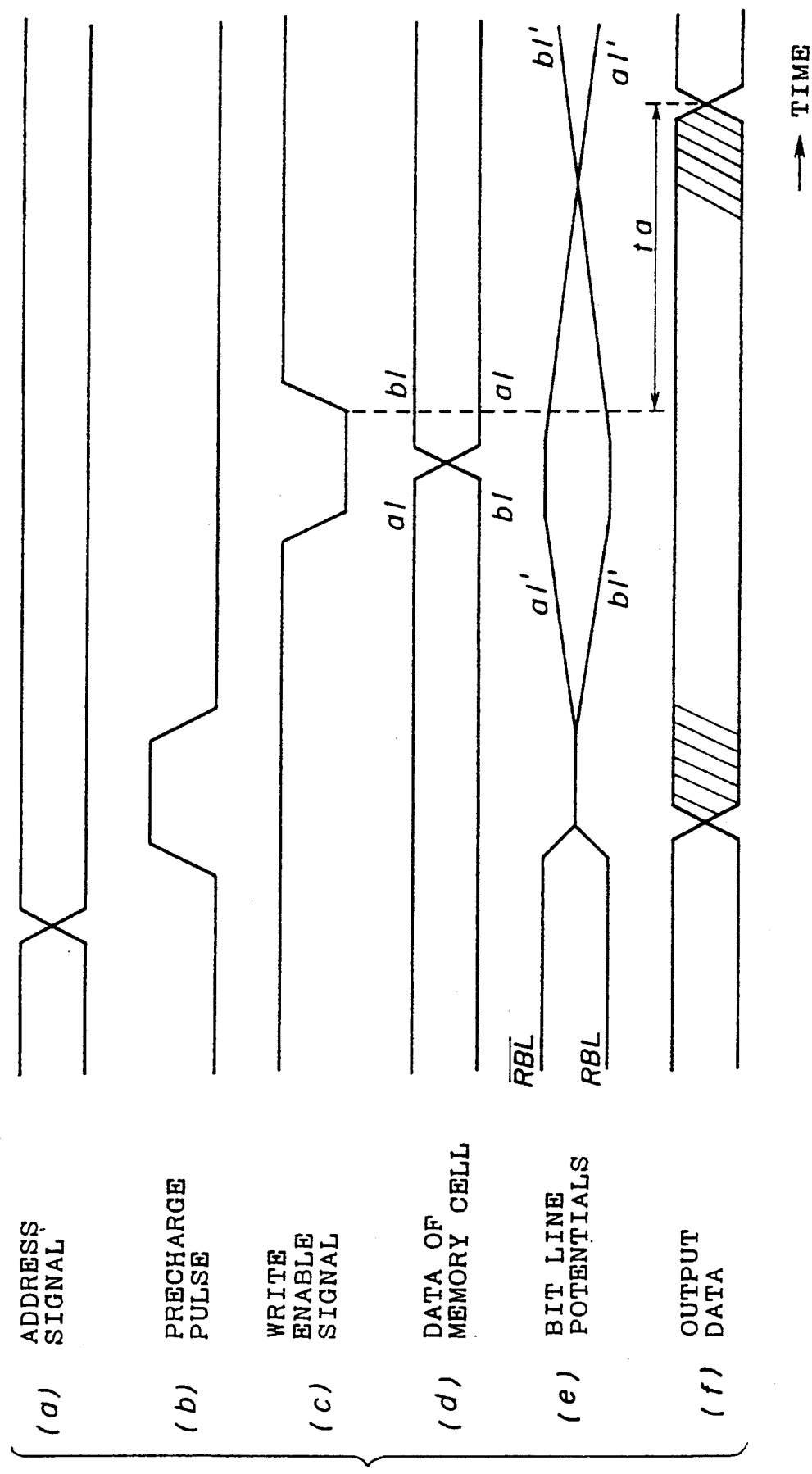

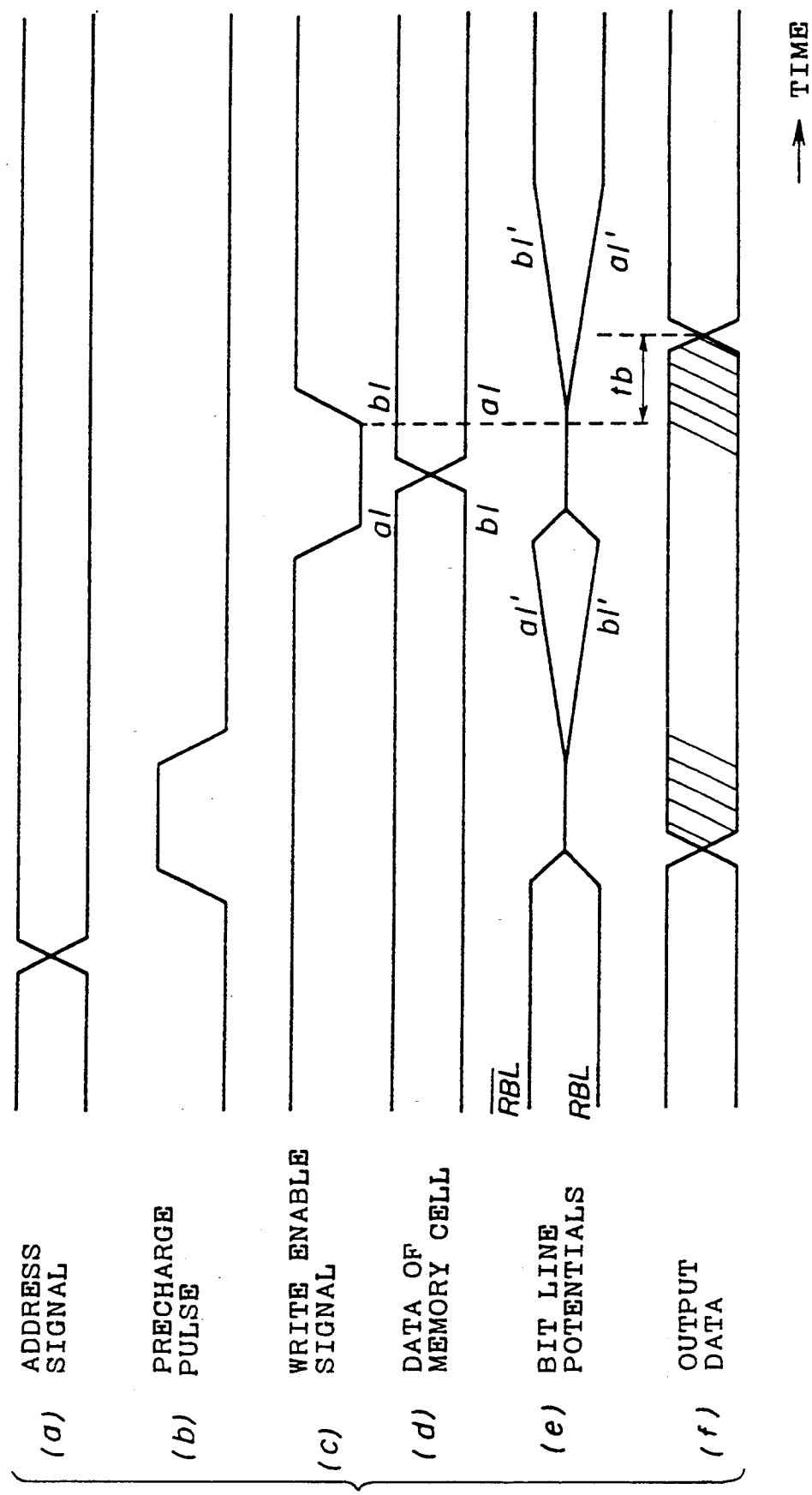

SEMICONDUCTOR MEMORY DEVICE

TECHNICAL FIELD

The present invention generally relates to semiconductor memory devices and, more particularly, to a semiconductor memory device such as a SRAM (static random access memory) which writes and reads information at a high speed.

BACKGROUND ART

Recently, various semiconductor memory devices such as the SRAM have been developed as semiconductor memory devices which write and read information at a high speed. The data is held in the SRAM as long as a predetermined power source voltage is maintained; further, no refresh operation is required, as in the case of a DRAM (dynamic random access memory). In the semiconductor memory devices such as the SRAM, there are demands to reduce the power consumption and to increase the operation speed.

As a conventional semiconductor memory device of this type, there is a single port SRAM shown in FIG. 1, for example. In this SRAM, Tn1 and Tn2 represent n-channel MOS transistors, INV1 and INV2 represent inverters, WL represents a word line, and BL and $\overline{BL}$ represent bit lines.

This SRAM uses the same bit lines BL and $\overline{BL}$ for writing and reading information. For this reason, the potentials of the bit lines BL and $\overline{BL}$ are held to the state of the write data after the write operation ends, and it takes almost no time to read out the data immediately after the write operation. However, because the same bit lines BL and $\overline{BL}$ are used for the write and read operations, there is a need to watch the change in the data (bit error) held by the memory cell. This bit error is a phenomenon in which the data held in the memory cell is inverted due to the load of the bit lines BL and $\overline{BL}$ when the word line WL is switched at the time of the data read out.

That is, in the SRAM of the type shown in FIG. 1, the word line WL and the bit lines BL and $\overline{BL}$ are respectively made up of several tens to several hundreds of aluminum lines, and the capacitance of the bit lines BL and $\overline{BL}$ is considerably large. For this reason, when the word line WL is switched, the potential difference of the bit lines BL and $\overline{BL}$ has a greater effect on the potentials of the n-channel MOS transistors Tn1 and Tn2 than the inverters INV1 and INV2 which invert the potentials of the n-channel MOS transistors Tn1 and Tn2, and there are cases where the above bit error occurs.

Conventionally, measures were taken against the bit error such as (1) reducing the potential difference of the bit lines BL and $\overline{BL}$ by pulling up the lower voltage level of the voltage levels applied to the bit lines BL and $\overline{BL}$ to approximately 2 V, for example, and (2) short-circuiting the bit lines BL and $\overline{BL}$ before switching the word line WL so as to eliminate the potential difference of the bit lines BL and $\overline{BL}$.

However, according to the conventional method (1), the lower voltage level of the bit lines BL and $\overline{BL}$ is pulled up to approximately 2 V. As a result, a voltage is applied to the bit lines even when the voltage level corresponds to the low level, presenting problem of the power consumption increasing.

On the other hand, according to the conventional method (2), the bit lines BL and $\overline{BL}$ are short-circuited before switching the word line WL. For this reason, a signal for short-circuiting the bit lines BL and $\overline{BL}$ must be generated internally. Hence, even if an attempt is made to perform a read operation after the write operation ends, for example, a time margin is required to generate this signal, and there is a problem in that the operation speed deteriorates.

As a measure against the the above two problems, a SRAM shown in FIG. 2 has been proposed. In this SRAM, Tn3 and Tn4 represent n-channel MOS transistors, INV3 and INV4 represent inverters, WBL and $\overline{WBL}$ represent bit lines exclusively for writing, and RBL and $\overline{RBL}$ represent bit lines exclusively for reading.

In this SRAM, dividing the bit lines BL and $\overline{BL}$ into the bit lines WBL and $\overline{WBL}$ exclusively for reading and the bit lines RBL and $\overline{RBL}$ exclusively for reading eliminates the time margin required by the above conventional method (2) in order to internally generate the signal for short-circuiting the bit lines BL and $\overline{BL}$. However, according to this structure in which the bit lines BL and $\overline{BL}$ are divided into the bit lines WBL and $\overline{WBL}$ exclusively for reading and the bit lines RBL and $\overline{RBL}$ exclusively for reading, a problem occurs if the capacitance of the bit lines BL and $\overline{BL}$ is large, that is, in the case of a large scale SRAM. In other words, when a write enable signal is changed from a low level to a high level and the read operation is carried out immediately after the write operation, the potentials of the n-channel MOS transistors Tn3 and Tn4 are inverted by the inverters INV3 and INV4 after the bit line potential on the write side is inverted when switching the word line WL, and it takes a considerably long time for the bit line potential on the read side to be inverted. As a result, when the data is read out immediately after the write operation, there are cases where the data before the write operation is carried out is read out, that is, the previous data before the potentials of the n-channel MOS transistors Tn3 and Tn4 are inverted is read out.

In FIG. 3, (a) shows an address signal, (b) shows the write enable signal, (c) shows the bit line potential on the write side, (d) shows the bit line potential on the read side, and (e) shows the output data of the memory.

Accordingly, a predetermined time interval must be provided before the read operation which is carried out immediately after the write operation, and there was a problem in that the access time becomes extremely long.

DISCLOSURE OF THE INVENTION

Accordingly, it is a general object of the present invention to provide a novel and useful semiconductor memory device in which the problems described above are eliminated.

Another and more specific object of the present invention is to provide a semiconductor memory device comprising a memory part, two bit lines exclusively for writing which are coupled to the memory part and used when writing information into the memory part, two bit lines exclusively for reading which are coupled to the memory part and used for reading information held in the memory part, and a short-circuiting circuit coupled to the bit lines exclusively for reading, which short-circuits the two bit lines exclusively for reading and sets them to the same potential in a write mode in which information is written into the memory part via the bit lines exclusively for writing. According to the present invention, the read out from the same address immediately after the write operation can also be carried out at a high speed, and a high-speed memory access is constantly possible while suppressing the power consumption.

Other objects and further features of the present invention will be apparent from the following detailed description when read in conjunction with the accompanying drawings.

BRIEF DESCRIPTION OF THE DRAWINGS

FIG. 7 is a timing chart for explaining a write operation of the embodiment;

FIG. 8 is a timing chart for explaining a normal read operation of the embodiment;

FIG. 9 is a timing chart for explaining a read operation immediately after a write operation in the conventional example shown in FIG. 2; and FIG. 10 is a timing chart for explaining a read operation immediately after a write operation in the embodiment.

BEST MODE OF CARRYING OUT THE INVENTION

Figure 4:
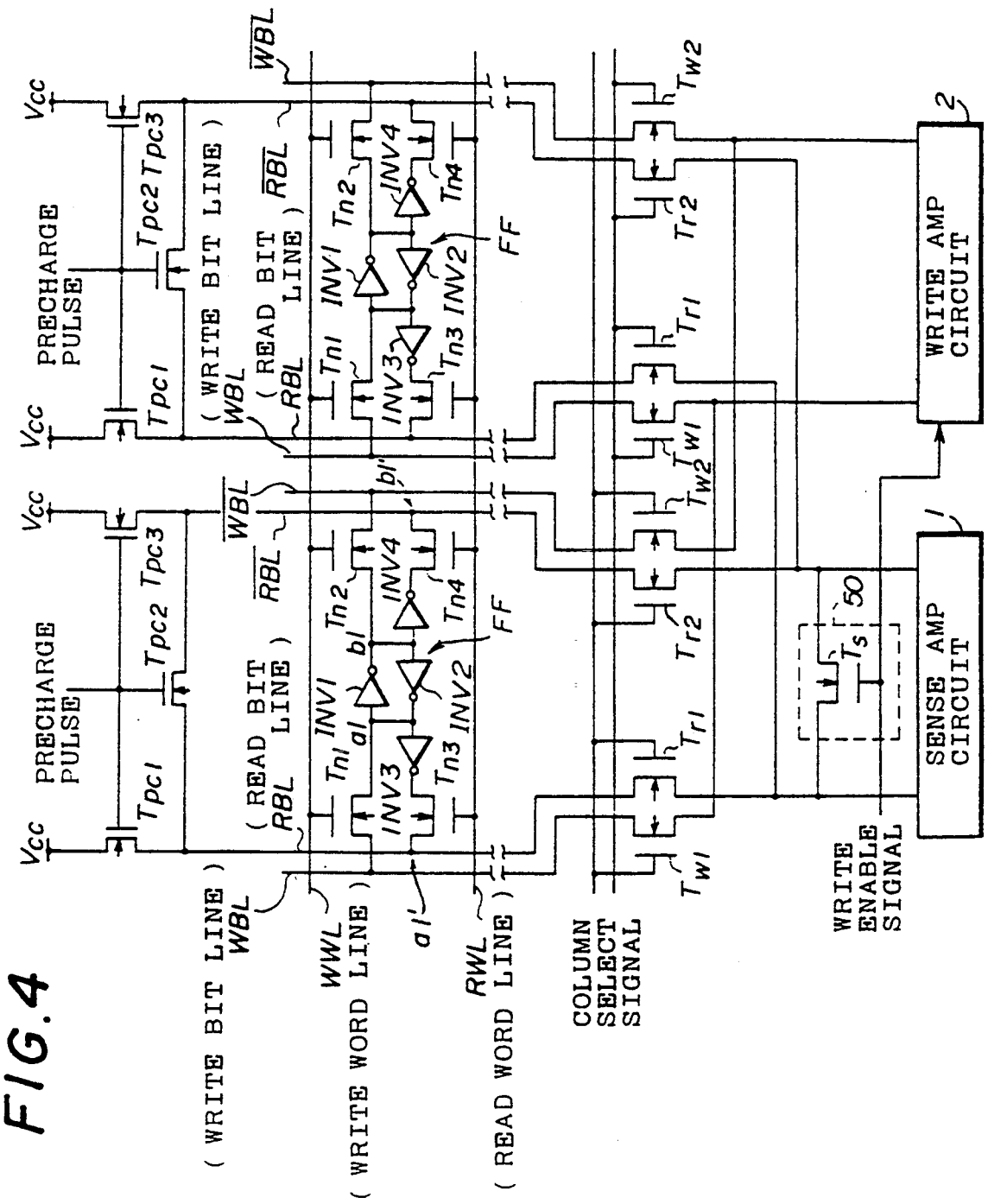
FIG. 4 is a circuit diagram showing an essential part of an embodiment of a semiconductor memory device according to the present invention.

FIG. 4 shows an embodiment of a semiconductor memory device according to the present invention.

A SRAM shown in FIG. 4 is provided with a flip-flop FF having respective input and output ends of two inverters INV1 and INV2 respectively cross connected, two switching transistors Tn1 and Tn2 respectively connected to two output ends of the flip-flop FF and two write bit lines WBL and $\overline{\text{WBL}}$ exclusively for writing and having gates connected to a write word line WWL exclusively for writing, two inverters INV3 and INV4 for inverting outputs from the two output ends of the flip-flop FF, and two switching transistors Tn3 and Tn4 respectively connected to the inverters INV3 and INV4 and two read bit lines RBL and $\overline{\text{RBL}}$ exclusively for reading and having gates connected to a read word line RWL exclusively for reading. When writing data to the flip-flop FF from the write bit lines WBL and $\overline{\text{WBL}}$, the two read bit lines RBL and $\overline{\text{RBL}}$ are short-circuited so as to set the read bit lines RBL and $\overline{\text{RBL}}$ to the same potential.

In FIG. 4, 1 represents a sense amplifier circuit, 2 represents a write amplifier circuit, Tr1 and Tr2 respectively represent switching transistors for reading, Tw1 and Tw2 respectively represent switching transistors for writing, and Ts represents an n-channel MOS transistor forming a short circuit 50. In addition, a precharge pulse which will be described later is applied to transistors Tpc1 through Tpc3.

In this embodiment, the two bit lines exclusively for reading are short-circuited when writing data to the flip-flop from the bit lines exclusively for writing, and the two bit lines exclusively for reading are set to the same potential.

In other words, even when carrying out the read operation immediately after the write operation, there is no need to invert the potentials of the bit lines exclusively for reading from the power source potential and the ground potential, and it is possible to quickly read the data by cancelling the short-circuiting of the bit lines exclusively for reading after the write operation ends.

Figure 5:
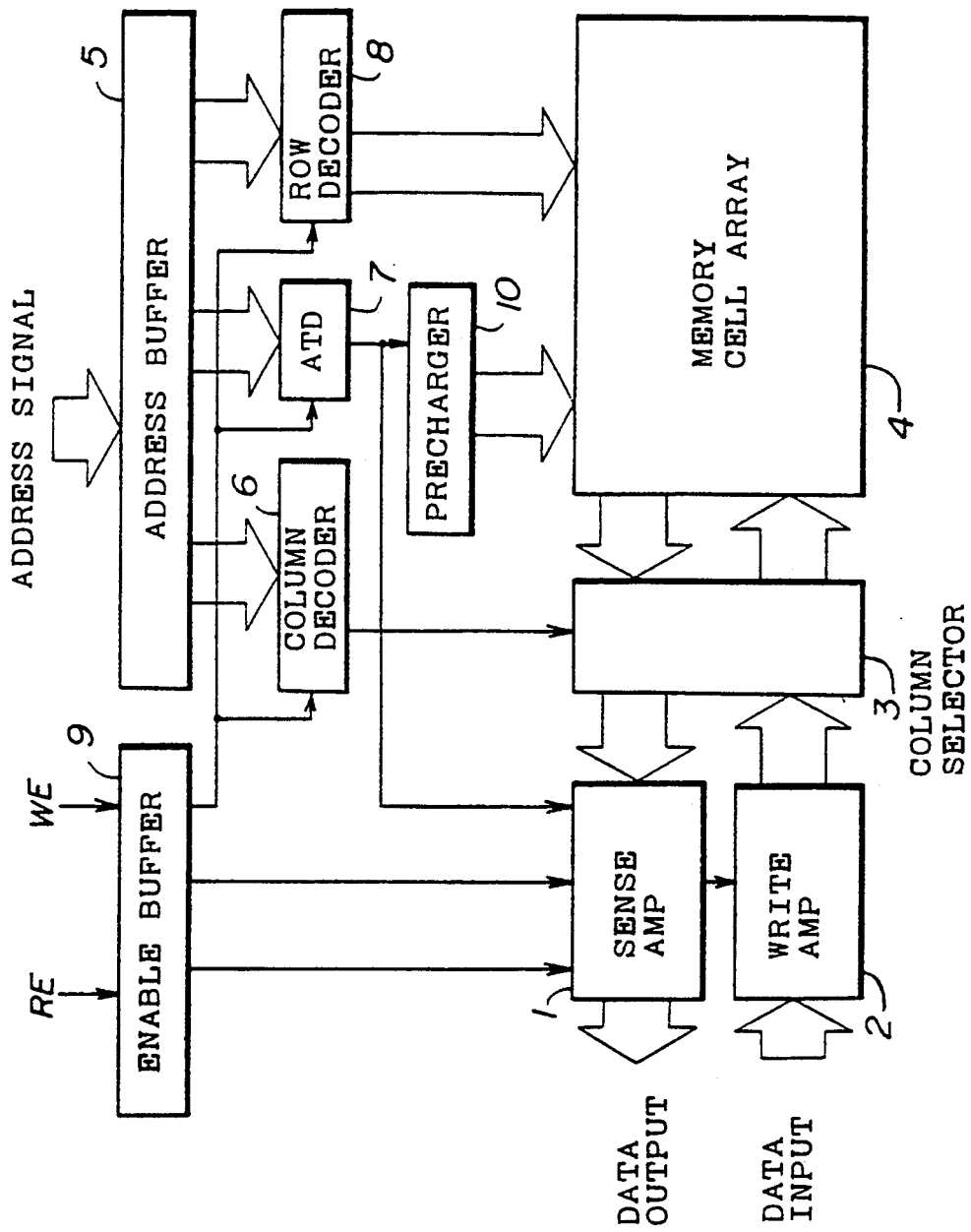
FIG. 5 is a block diagram showing the entire construction of the embodiment of the present invention.

FIG. 5 is a block diagram showing the entire construction of this embodiment. In FIG. 5, the SRAM generally comprises a sense amplifier 1, a write amplifier 2, a column selector 3, a memory cell array 4, an address buffer 5, a column decoder 6, an address transition detection (hereinafter referred to as ATD) circuit 7, a row decoder 8, an enable buffer 9 and a precharger 10. RE denotes a read enable signal and WE denotes a write enable signal.

The sense amplifier 1 detects and amplifies a signal from the memory cell at the time of the read out, and the write amplifier 2 supplies a write signal to the memory cell. The column selector 3 determines a signal path of the write and read signals, and is made up of the switching transistors Tr1, Tr2, Tw1 and Tw2 shown in FIG. 4. The memory cell array 4 has the memory cells for storing information arranged in a matrix form. The address buffer 5 latches address information for carrying out the write and read operations, and outputs this information to the column decoder 6, the ATD circuit 7 and the row decoder 8 together with an enable signal from the enable buffer 9.

The ATD circuit 7 detects an address transition and generates a predetermined pulse. The generated pulse is output to the memory cell array 4 via the precharger 10 as a precharge pulse.

A diagram showing the particular circuit construction is similar to the circuit diagram shown in FIG. 4. Next, a description will be given of the read and write operations by referring to FIGS. 6 and 7.

Figure 6:
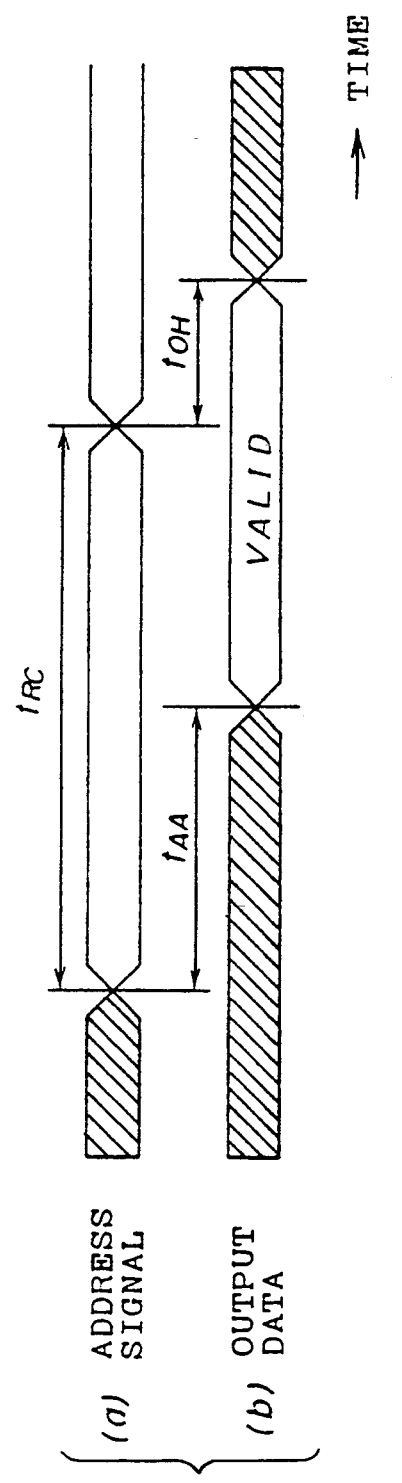
FIG. 6 is a timing chart for explaining a read operation of the embodiment.

In FIGS. 6 and 7, $t_{RC}$ denotes a read cycle time, $t_{AA}$ denotes an address access time, $t_{OH}$ denotes a data hold time corresponding to the address transition, $t_{WC}$ denotes a write cycle time, $t_{AW}$ denotes an address settle time corresponding to the write enable signal WE, $t_{AS}$ denotes an address setup time $t_{WP}$ denotes a write pulse width $t_{WR}$ denotes a write recovery time, $t_{DW}$ denotes a data setup time, $t_{DH}$ denotes a data hold time, and VALID denotes a time period in which the data is valid.

First, in the case of the read operation, the data is output a predetermined time (address access time $t_{AA}$) after the address undergoes a transition, as shown in FIG. 6, and the level of the write enable signal WE becomes high.

In FIG. 6, (a) shows the address signal and (b) shows the output data of the memory.

Next, in the case of the write operation, when the level of the write enable signal WE is made low after the address settles, as shown in FIG. 7, the n-channel MOS transistor Ts, which forms the short-circuiting circuit 50 turns OFF and the state becomes the write state. The write pulse width $t_{WP}$ indicates a minimum value, and the write operation is not guaranteed if the width of the low-level write enable signal WE is less than or equal to the write pulse width $t_{WP}$. In addition, the set up time $t_{DW}$ of the input data and the hold time $t_{DH}$ are determined with respect to the rising edge of the write enable signal WE.

In FIG. 7, (a) shows the address signal, (b) shows the write enable signal, and (c) shows the output data of the memory.

That is, if the read operation is carried out immediately after the write operation, the reading of the data is quickly carried out after the write operation ends by cancelling the short-circuiting of the bit lines exclusively for the reading.

Accordingly, the read out from the same address after the write operation ends is carried out at a high speed even with the low power consumption, and the characteristic of the RAM is improved.

In this embodiment, when carrying out the read operation immediately after the write operation, there is no need to invert the respective potentials of the bit lines used exclusively for reading from the power source potential and the ground potential. Thus, it is possible to quickly read out the data after the write operation ends by cancelling the short-circuiting of the bit lines used exclusively for reading, and a high-speed processing is possible while nevertheless suppressing power consumption.

Next, a description will be given of the effects of this embodiment in comparison with the conventional example shown in FIG. 2.

First, the normal read operation will be described in conjunction with FIG. 8. If the level of the precharge pulse becomes high as shown in FIG. 8(b) after the address signal undergoes a transition as shown in FIG. 8(a), the read bit lines RBL and $\overline{RBL}$ in FIG. 4 are short-circuited because the transistor $T_{TPC2}$ is ON. Hence, the potentials of the read bit lines RBL and $\overline{RBL}$ become the same as shown in FIG. 8(c), and the output data can be obtained as shown in FIG. 8(d) by amplifying the potential difference of the read bit lines RBL and $\overline{RBL}$ thereafter by the sense amplifier circuit 1. Accordingly, the read out of the data is carried out at a high speed. This normal read operation is the same as that of the conventional example shown in FIG. 2.

Figure 1:
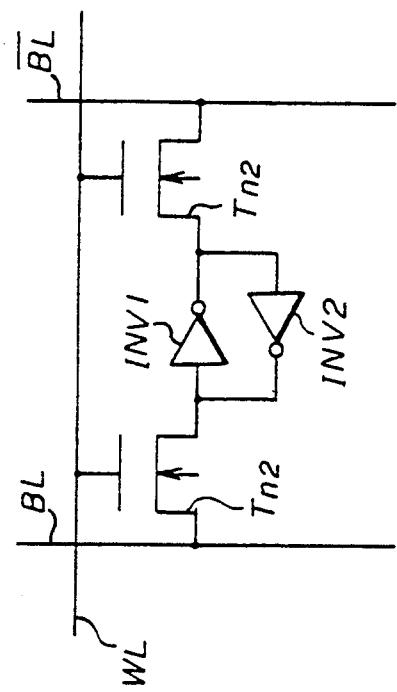
FIG. 1 is a circuit diagram showing an essential part of an example of a conventional semiconductor memory device.
Figure 2:
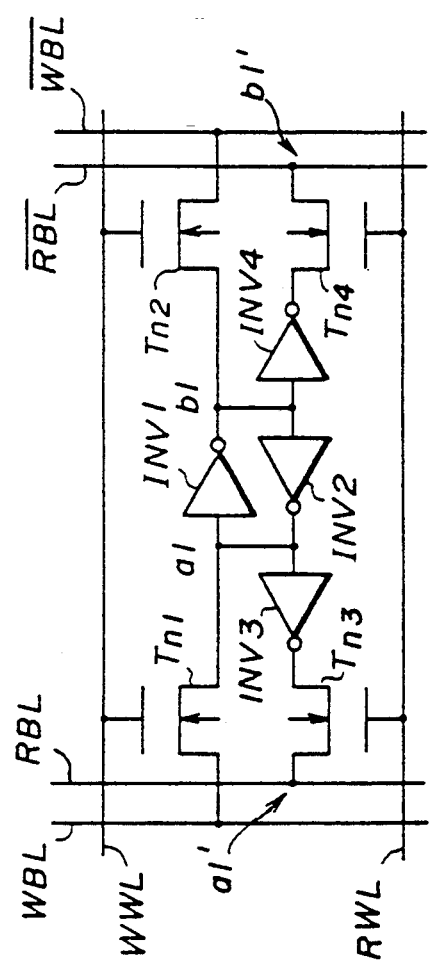
FIG. 2 is a circuit diagram showing an essential part of another example of the conventional semiconductor memory device.
Figure 3:
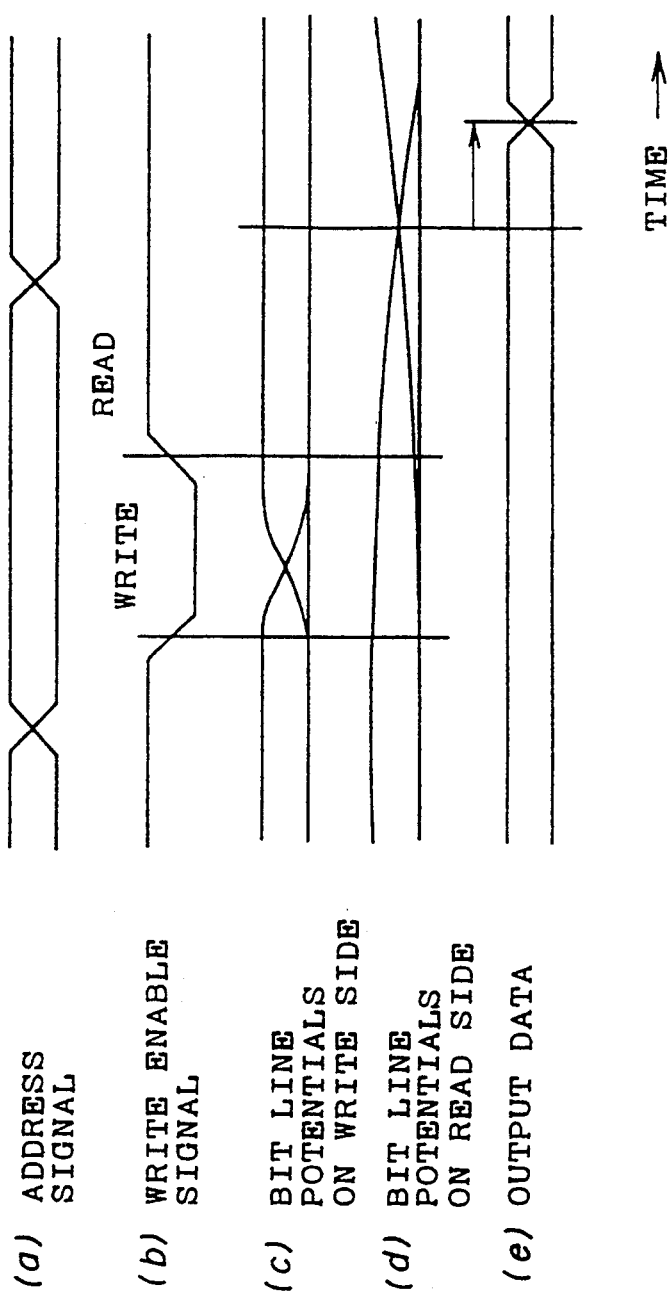
FIG. 3 is a timing chart for explaining the operation of the semiconductor memory device shown in FIG. 2.

FIG. 9 is a timing chart for explaining the case where the read operation is carried out immediately after the write operation in the conventional example shown in FIG. 2. In FIG. 9, (a) shows the address signal, (b) shows the precharge pulse, (c) shows the write enable signal, (d) shows the data of the memory cell, (e) shows the potentials of the read bit lines RBL and $\overline{RBL}$, and (f) shows the output data of the memory. In addition, a1, a1', b1 and b1' respectively correspond to the potentials at the nodes shown in FIG. 2.

In the case of FIG. 9, after the level of the write enable signal shown in (c) becomes low and the data of the memory cell inverts as shown in (d), a time ta required to obtain the output data of (f) measured from the time when the data of the memory cell is read out to the read bit lines RBL and $\overline{RBL}$ as shown in (e) to the time when the potential difference is amplified in the sense amplifier circuit 1, is long. For this reason, according to the conventional example shown in FIG. 2, the read operation immediately after the write operation cannot be carried out at a high speed although the normal read operation can be carried out at the high speed. As a result, the access time is long when the read operation is carried out with respect to the same address immediately after the write operation.

On the other hand, FIG. 10 is a timing chart for explaining the read operation immediately after the write operation in the embodiment shown in FIG. 4. In FIG. 10, (a) shows the address signal, (b) shows the precharge pulse, (c) shows the write enable signal, (d) shows the data of the memory cell, (e) shows the potentials of the read bit lines RBL and BL/, and (f) shows the output data of the memory. In addition, a1, a1', b1 and b1' respectively correspond to the potentials at the nodes shown in FIG. 4.

In the case of FIG. 10, after the level of the write enable signal shown in (c) becomes low and the data of the memory cell inverts as shown in (d), a time tb required to obtain the output data of (f), measured from the time when the data of the memory cell is read out to the read bit lines RBL and $\overline{RBL}$ shown as in (e) to the time when the potential difference is amplified in the sense amplifier circuit 1, is extremely short. This is because the transistor Ts of the short-circuiting circuit 50 short-circuits the read bit lines RBL and $\overline{RBL}$ and sets them to the same potential in response to the low-level write enable signal. As a result, the data of the memory cell is read out to the read bit lines RBL and $\overline{RBL}$ at a higher speed in FIG. 10, when compared to the case shown in FIG. 9, and it is possible to obtain the output data extremely quickly. Therefore, it may be seen that even the read operation immediately after the write operation can also be carried out at the high speed according to this embodiment.

Further, the present invention is not limited to these embodiments, but various variations and modifications may be made without departing from the scope of the present invention.

As described above, according to the semiconductor memory device of the present invention, a short-circuiting circuit is provided to short-circuit the bit lines which are used exclusively for reading, when writing data so as to set these bit lines to the same potential, and thus, it is possible to carry out a high speed read operation even with respect to the same address, immediately after the write operation and further, and it is possible to constantly realize a high-speed memory access while suppressing the power consumption. For these reasons, the present invention is extremely useful from the practical point of view.

What is claimed is:

1. A semiconductor memory device having a write mode and a read mode, comprising:

a memory part;

first and second write bit lines coupled to said memory part and used exclusively when writing information into said memory part;

first and second read bit lines coupled to said memory part and used exclusively when reading information, held in said memory part, from said memory part; and a short-circuiting circuit coupled to said first and second read bit lines and operative in the write mode of the semiconductor memory device for short-circuiting the first and second read bit lines and thereby setting the first and second read bit lines to a common potential in the write mode of the semiconductor memory device.

2. A semiconductor memory device as recited in claim 1, further comprising:

a write word line coupled to said memory part and used exclusively when writing information into said memory part;

a read word line coupled to said memory part and used exclusively when reading information, held in said memory part, from said memory part; and said memory part further comprising:

a flip-flop comprising a pair of first and second inverters having respective inputs and outputs, cross-connected between the respective inputs and outputs thereof, and having first and second outputs, first and second switching transistors respectively connected to and coupling said first and second outputs of said flip-flop to the first and second write bit lines and having respective gates connected in common to said write word line, third and fourth inverters connected to the flip-flop and receiving, and inverting, the respective first and second outputs of the flip-flop, and third and fourth switching transistors respectively connecting said third and fourth inverters to the first and second read bit lines, respectively, and having corresponding gates connected in common to said read word line.

3. A semiconductor memory device as recited in claim 1 and having a read mode, further comprising:

a sense amplifier circuit which detects and amplifies information read from the memory part in the read mode of the semiconductor memory device by detecting and amplifying a potential difference between said first and second read bit lines during the read mode.

4. A semiconductor memory device as recited in claim 1 and having a write mode, further comprising:

a write amplifier circuit which, in response to a write enable signal in the write mode of operation of the semiconductor memory device, supplies, to the first and second write bit lines, the information to be written into the memory part.

5. A semiconductor memory device as recited in claim 4, wherein the short-circuiting circuit short-circuits the first and second read bit line in response to the write enable signal.

6. A semiconductor memory device as recited in claim 1, further comprising:

an address transition detection circuit for detecting a transition of an address signal and, in response thereto, outputting a corresponding address transition detection pulse; and a setting circuit which short-circuits the first and second read bit lines in response to the detection pulse output by the address translation detection circuit.

7. A semiconductor memory device as recited in claim 6, wherein:

the short-circuiting circuit and the setting circuit set the first and second read bit lines to a common potential in an initial state of the read mode of the semiconductor memory device, preceding a state of the read mode in which information is read from the memory part at a selected address thereof by the first and second read bit lines, regardless of the immediately preceding mode of the semiconductor memory device and for the same selected address thereof.

* * * * *

UNITED STATES PATENT AND TRADEMARK OFFICE
CERTIFICATE OF CORRECTION

PATENT NO. : 5,345,425
DATED : September 6, 1994
INVENTOR(S) : SHIKATANI

It is certified that error appears in the above-indentified patent and that said Letters Patent is hereby corrected as shown below:

Title page, item: [21] Appl. No.:, change "852,638" to --854,638--.

Col. 1, line 19, after "devices" insert --,--.

Col. 5, line 57, after "(f)" insert --,--.

Col. 6, line 7, change "BL/" to -- $\overline{RBL}$ --;
line 16, change "shown as" to --as shown--;
line 40, after "tion" insert --,--.

Signed and Sealed this

Twenty-second Day of November, 1994

Attest:

BRUCE LEHMAN

*Attesting Officer*    *Commissioner of Patents and Trademarks*